(12) United States Patent
Yang et al.

(10) Patent No.: US 10,817,089 B2
(45) Date of Patent: Oct. 27, 2020

(54) DISPLAY COMPONENT AND METHOD FOR MANUFACTURING THE SAME, DISPLAY DEVICE

(71) Applicants: BOE TECHNOLOGY GROUP CO., LTD., Beijing (CN); Beijing BOE Display Technology Co., Ltd., Beijing (CN)

(72) Inventors: Zhaokun Yang, Beijing (CN); Yun Qiu, Beijing (CN); Sha Liu, Beijing (CN); Xiao Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 182 days.

(21) Appl. No.: 15/983,154

(22) Filed: May 18, 2018

(65) Prior Publication Data

US 2019/0042036 A1 Feb. 7, 2019

(30) Foreign Application Priority Data

Aug. 7, 2017 (CN) .......................... 2017 1 0667287

(51) Int. Cl.
*G06F 3/041* (2006.01)
*G06K 9/00* (2006.01)
(Continued)

(52) U.S. Cl.
CPC .......... *G06F 3/0412* (2013.01); *G02F 1/1333* (2013.01); *G02F 1/13318* (2013.01);
(Continued)

(58) Field of Classification Search
CPC ............ G06F 3/0412; G02F 1/133526; G02F 2001/133357; G02F 1/1333; G06K 9/0004
See application file for complete search history.

(56) References Cited

U.S. PATENT DOCUMENTS

| 2009/0040155 A1* | 2/2009 | Watanabe ......... G02F 1/133526 345/87 |
| 2016/0178965 A1* | 6/2016 | Takayama .......... G02B 27/0018 359/626 |

(Continued)

FOREIGN PATENT DOCUMENTS

| CN | 1445734 A | 10/2003 |
| CN | 102812510 A | 12/2012 |

(Continued)

OTHER PUBLICATIONS

First Office Action for Chinese Patent Application No. 201710667287.7 dated Mar. 4, 2019.

*Primary Examiner* — Patrick N Edouard
*Assistant Examiner* — Douglas M Wilson
(74) *Attorney, Agent, or Firm* — Calfee, Halter & Griswold LLP

(57) ABSTRACT

The present disclosure provides a display component, a method for manufacturing the same, and a display device. The display component includes a display panel, and a light converging layer and a functional panel sequentially disposed on the display side of the display panel. The display panel includes a plurality of pixels, each pixel includes a plurality of sub-pixels, and the light converging layer includes a plurality of light converging units, one light converging unit is disposed on each of the sub-pixels, the functional panel includes a plurality of functional units. The functional unit may be provided with at least one of a sensor functional unit and a solar energy acquisition unit. A trans- (Continued)

parent area is provided between every two adjacent functional units, and each transparent area corresponds to each of the plurality of sub-pixels in a one-to-one correspondence.

11 Claims, 5 Drawing Sheets

(51) Int. Cl.
  *G02F 1/1333*    (2006.01)
  *G02F 1/1335*    (2006.01)
  *H01L 31/0224*   (2006.01)
  *G02F 1/133*    (2006.01)

(52) U.S. Cl.
  CPC ..... *G02F 1/133526* (2013.01); *G06K 9/0004* (2013.01); *H01L 31/0224* (2013.01); *G02F 2001/13324* (2013.01); *G02F 2001/133357* (2013.01)

(56) References Cited

U.S. PATENT DOCUMENTS

| | | | |
|---|---|---|---|
| 2018/0095559 A1* | 4/2018 | Yamazaki | G06F 3/0416 |
| 2019/0065807 A1* | 2/2019 | Mizuhashi | G02F 1/13338 |
| 2020/0192510 A1* | 6/2020 | Liu | B32B 15/09 |

FOREIGN PATENT DOCUMENTS

| | | |
|---|---|---|
| CN | 104067163 A | 9/2014 |
| CN | 104766540 A | 7/2015 |
| CN | 205656407 U | 10/2016 |
| CN | 106502455 A | 3/2017 |

\* cited by examiner

DISPLAY COMPONENT AND METHOD FOR MANUFACTURING THE SAME, DISPLAY DEVICE

CROSS REFERENCE TO RELATED APPLICATIONS

This application claims the benefit of China Patent Application No. 201710667287.7 filed with the China Patent Office on Aug. 7, 2017, the entire content of which is hereby incorporated by reference.

TECHNICAL FIELD

The present disclosure relates to the field of display panel manufacturing, and in particular to a display component, a method for manufacturing the same, and a display device.

BACKGROUND

With the rapid development of technology, in addition to display function, a display component of a display device can also be integrated with other functions, such as fingerprint recognition function.

Currently, the display component generally includes a display panel integrated with other functional modules. The display panel includes a plurality of pixels arranged in an array. Each pixel may include three types of sub-pixels: red, green, and blue. Other functional modules include a plurality of functional units. The plurality of functional units are arranged in gaps of pixels or sub-pixels to achieve corresponding functions.

In the related art, the functional units of such functional modules require a large size. In order to ensure the effective provision of the functional units, the functional units are generally provided with sufficient provision areas by reducing the size of the sub-pixels.

However, reducing the size of the sub-pixels will cause the display brightness of the display panel to decrease. To ensure the brightness of the display panel, the occupied area of the functional units of other functional modules cannot be ensured. Therefore, it cannot realize compatibility of the display function and other functions of the current display component.

SUMMARY

In a first aspect, there is provided a display component including: a display panel, and a light converging layer and a functional panel sequentially disposed on a display side of the display panel, wherein the functional panel is configured to implement a preset non-display function;

wherein the display panel includes a plurality of pixels arranged in an array, each of the pixels includes a plurality of sub-pixels, the light converging layer includes a plurality of light converging units arranged in an array, each of the sub-pixels is provided with one of the light converging units, the functional panel includes a plurality of functional units arranged in an array, a transparent area is provided between every two adjacent functional units, each transparent area on the functional panel corresponds to each of the plurality of sub-pixels on the display panel in a one-to-one correspondence, and collimated light emitted by each sub-pixel is converged by the corresponding light converging unit and is emitted to the corresponding transparent area.

Optionally, the plurality of functional units include at least one of a sensor functional unit configured to implement a sensor function and a solar energy acquisition unit configured to implement a solar cell function. The sensor functional unit includes at least one of a fingerprint acquisition sensor unit, an infrared sensor unit and a photosensor unit.

Optionally, the display component further includes:

a planarization layer disposed between the light converging layer and the functional panel, and a refractive index of the planarization layer is smaller than a refractive index of the light converging layer.

Optionally, the planarization layer is made of an optically clear adhesive OC.

Optionally, the light converging unit is a condenser lens.

Optionally, a gap between every two adjacent sub-pixels is a gap area, and a sum of projection areas of each functional unit and one adjacent transparent area on the display panel is equal to a sum of projection areas of one sub-pixel and one gap area on the display panel, and an orthographic projection of each sub-pixel on the functional panel covers the corresponding transparent area.

Optionally, a ratio of a projection area of each functional unit to a projection area of one adjacent transparent area on the display panel is about 8:2.

Optionally, the display panel is an organic light emitting diode display panel, a liquid crystal display panel, or a micro light emitting diode display panel.

In a first aspect, there is provided a method for manufacturing a display component, including:

providing a display panel;

forming a light converging layer on a display side of the display panel; and forming a functional panel on the light converging layer, and the functional panel is configured to implement a preset non-display function;

wherein the display panel includes a plurality of pixels arranged in an array, each of the pixels includes a plurality of sub-pixels, the light converging layer includes a plurality of light converging units arranged in an array, each of the sub-pixels is provided with one of the light converging units, the functional panel includes a plurality of functional units arranged in an array, a transparent area is provided between every two adjacent functional units, each transparent areas on the functional panel corresponds to one of the plurality of sub-pixels on the display panel in a one-to-one correspondence, and collimated light emitted by each sub-pixel is converged by the corresponding light converging unit and is emitted to the corresponding transparent area.

Optionally, forming a light converging layer on a display side of the display panel includes:

forming the light converging layer on the display side of the display panel by using nanoimprint technology.

Optionally, forming a functional panel on the light converging layer includes:

providing a functional panel, the functional panel including a base substrate and a plurality of functional units disposed on the base substrate;

forming a planarization layer on the light converging layer; and forming the functional panel on the planarization layer.

Optionally, the planarization layer is made of OC, and forming the functional panel on the planarization layer includes:

adhering the functional panel on the light converging layer with the OC adhesive through charge-coupled device CCD alignment technology.

Optionally, the plurality of functional units include at least one of a sensor functional unit configured to implement a sensor function and a solar energy acquisition unit configured to implement a solar cell function, and the sensor functional unit includes at least one of a fingerprint acquisition sensor unit, an infrared sensor unit, and a photosensor unit.

In a third aspect, there is provided a display device, including:

the display component according to any one of the first aspect.

Optionally, the display device further includes:

a touch panel disposed on the functional panel; or a touch panel disposed on a non-display side of the display panel.

BRIEF DESCRIPTION OF THE DRAWINGS

In order to more clearly illustrate the embodiments of the present disclosure, the drawings used in the description of the embodiments will be briefly described below. Apparently, the drawings in the following description are merely some embodiments of the present disclosure, and for those skilled in the art, other drawings may also be obtained on the basis of these drawings without any creative effort.

FIG. 7-1 is a flowchart of a method for manufacturing a display component according to an embodiment of the present disclosure.

FIG. 7-2 is a partial structural diagram of a display component according to an embodiment of the present disclosure.

FIG. 7-3 is a flowchart of a method for manufacturing a functional panel according to an embodiment of the present disclosure.

FIG. 7-4 is a partial schematic structural diagram of another display component according to an embodiment of the present disclosure.

The accompanying drawings herein are incorporated in and constitute a part of this specification, illustrate embodiments consistent with the present disclosure, and together with the description serve to explain the principles of the disclosure.

DETAILED DESCRIPTION

To make the objectives, technical solutions, and advantages of the present disclosure more comprehensible, the present disclosure will be described in details below with reference to the accompanying drawings. Apparently, the described embodiments are merely some but not all of the embodiments of the present disclosure. All other embodiments obtained by a person of ordinary skill in the art based on the embodiments of the present disclosure without creative efforts shall fall within the protection scope of the present disclosure.

With the rapid development of technology, in addition to display function, display components of the display device can also be integrated with other functions such as fingerprint recognition. Currently, a display component generally includes a display panel integrated with other functional modules. The display panel includes a plurality of pixels arranged in an array. Each pixel may include at least two sub-pixels, and other functional modules include a plurality of functional units. The plurality of functional units is set in the same layer as the plurality of pixels, but there are some contradictions in the arrangement of the functional units and the sub-pixels. For example, reducing the size of the sub-pixels will cause the display brightness of the display panel to decrease. To ensure the brightness of the display panel, the area occupied by the functional units of other functional modules cannot be ensured. Therefore, it cannot realize compatibility of the display function and other functions of the current display component.

Figure 1:
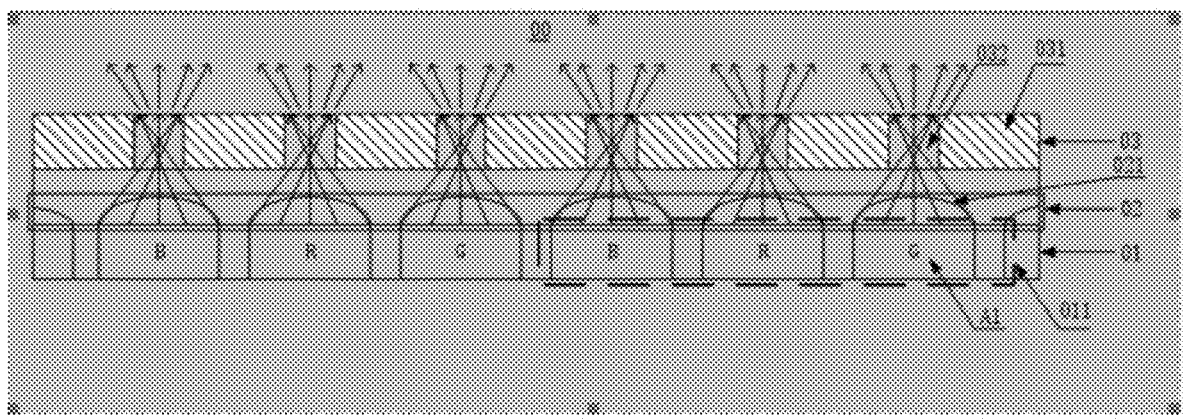
FIG. 1 is a schematic structural diagram of a display component according to an embodiment of the present disclosure.

In order to solve the currently existing problems, an embodiment of the present disclosure provides a display component 00, as shown in FIG. 1, including:

a display panel 01, and a light converging layer 02 and a functional panel 03 sequentially disposed on the display side of the display panel 01. The functional panel 03 is configured to implement a preset non-display function, such as a solar energy collecting function or an infrared sensing function. The display panel 01 may be an organic light-emitting diode (OLED) or a liquid crystal display (LCD) display panel or a micro light emitting diode (LED) display panel. The micro LED, also called a micro-LED, a micro-LED display panel, is a display panel manufactured using LED micro-reduction and matrix technology. In practical application, the display panel may also be other types of display. The panel is not limited in this embodiment of the present disclosure.

The above display panel 01 includes a plurality of pixels 011 arranged in an array. Each pixel 011 includes a plurality of sub-pixels A1. The light converging layer 02 includes a plurality of light converging units 021 arranged in an array, and one light converging unit is disposed on each sub-pixel A1. 021, the light converging unit 021 may be a condenser lens. The above functional panel 03 includes a plurality of functional units 031 arranged in an array. A gap between every two adjacent functional units 031 is a transparent area 032. The transparent area 032 may be a hollow area, that is, an area without any filler, or may also be filled with a transparent material, such as optically clear adhesive (OC, also called OC adhesive or optical adhesive).

Each of the plurality of transparent areas 032 on the functional panel 03 corresponds to each of the plurality of sub-pixels A1 on the display panel 01 in a one-to-one correspondence. The collimated light emitted from each sub-pixel A1 is converged by the corresponding light converging unit 021 and emitted to the corresponding transparent area 032. It should be noted that in FIG. 1, it is assumed that each pixel 011 includes three sub-pixels A, respectively a red pixel R, a green pixel G, and a blue pixel B. In practical application, each pixel 011 may include two sub-pixels or four sub-pixels, and so on, which is not limited in this embodiment of the present disclosure.

Accordingly, the display component according to the embodiment of the present disclosure has a light converging layer and a functional panel disposed on the display panel. That is, the display panel and the functional panel are disposed in different layers such that the collimated light emitted from each sub-pixel can be converged by the corresponding light converging unit and emitted to the corresponding transparent area. In this way, without reducing the sizes of the sub-pixels and the functional units, it can ensure the actual brightness of the light emitted by the display component. Therefore, it can achieve excellent compatibility of the display function and other functions of the current display component.

Figure 2:
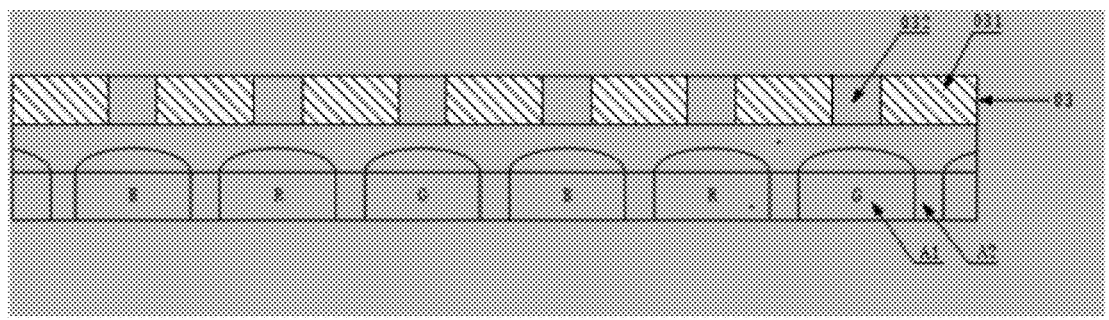
FIG. 2 is a schematic structural diagram of another display component according to an embodiment of the present disclosure.

In practical application, as shown in FIG. 2, the gap between every two adjacent sub-pixels A1 is the gap area A2. The sum of the projection areas of each functional unit 031 and one adjacent transparent area 032 on the display panel is equal to the sum of the projection areas of one sub-pixel A1 and one gap area A2 on the display panel. The orthographic projection of each sub-pixel A1 on the functional panel 03 covers the corresponding transparent area 032, thereby it can ensure that the collimated light emitted from the sub-pixel can effectively be transmitted through the transparent area.

Figure 3:
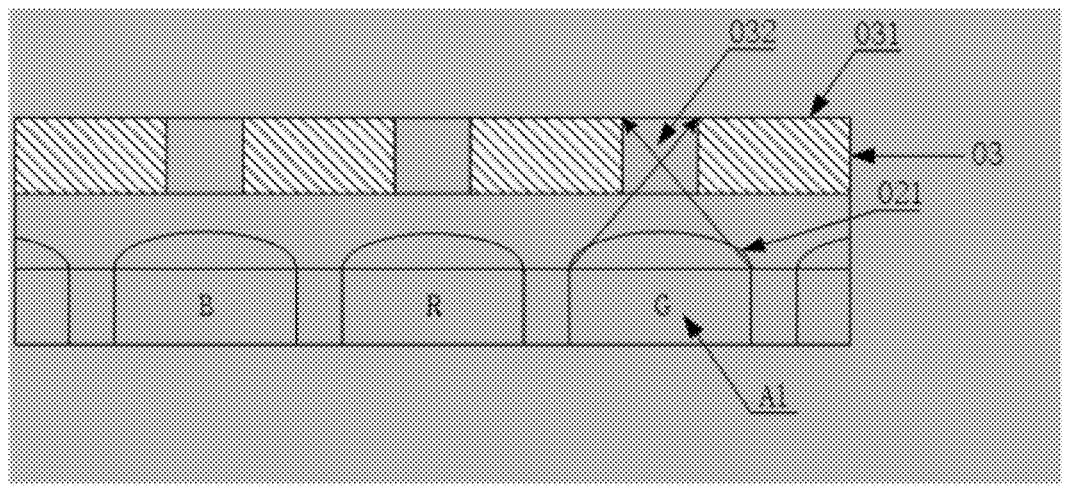
FIG. 3 is a schematic structural diagram of still another display component according to an embodiment of the present disclosure.

For example, as shown in FIG. 3, the projection of the sub-pixel A1 on the functional panel 03 after being converged by the light converging units 021 covers the transparent area 032. Optionally, the projection shape of the transparent area may be rectangular, the projection shape of the light converging units 021 corresponding to the transparent area may be rectangular, and the centers of the two rectangular coincide. In this way, it can ensure that the light converging units 021 right faces the transparent area and ensure the maximum light transmittance.

In practical application, the ratio of the projection area of each functional unit 031 to the projection area of one adjacent transparent area 032 on the display panel may be about 8:2. It should be understood that the above ratio 8:2 is not strict, and there may be a reasonable tolerance, for example, the ratio may also be 8:1.99 or 8:2.01 or 7.99:1 and etc., which are also acceptable. With such ratio of projection areas, the size of the functional unit 031 does not affect the light emission efficiency of light from the light transmitting area, and it can ensure excellent display brightness of the display component. It should be noted that the ratio of the projection area of each functional unit 031 and the projection area of one adjacent transparent area 032 on the display panel may also be set as other ratios according to a practical scene, for example, 1:1 or 5:3, etc., which is not limited by an embodiment of the present disclosure.

Figure 4:
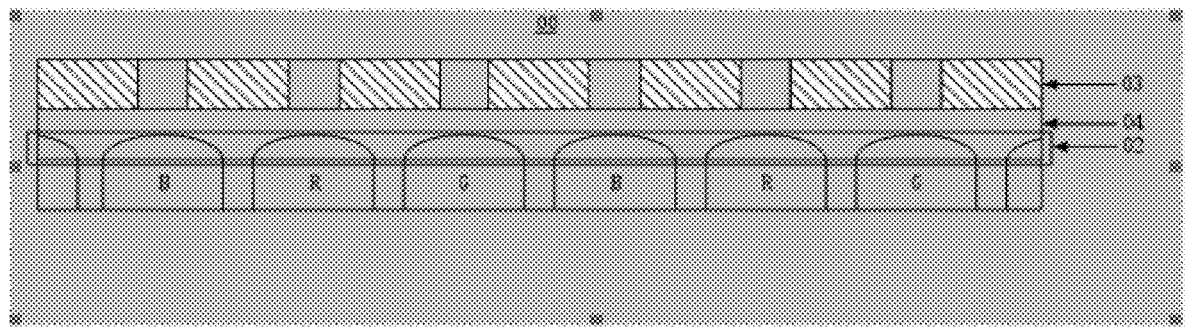
FIG. 4 is a schematic structural diagram of still another display component according to an embodiment of the present disclosure.

In an embodiment, as shown in FIG. 4, the display component 00 may include a planarization layer 04. The planarization layer is disposed between the light converging layer 02 and the functional panel 03. The refractive index of the planarization layer 04 is smaller than that of the light converging layer 02, to ensure the effective emission of light and avoid the phenomenon of total reflection. The total reflection phenomenon refers to the phenomenon that when light is emitted from an optically dense medium to an optically thin medium with the incident angle exceeding a certain angle, the refracted light completely disappears and only the reflected light remains.

In practical application, the above planarization layer is made of OC adhesive. The OC adhesive is a high-molecular material with optical properties similar to those of optical components, and has excellent adhesive properties. The use of optical adhesive can ensure the light transmittance of more than 90%, and can ensure the effective emission of light, and the optical adhesive has desirable cementation strength, and can ensure the effective bonding of the functional panel and the light converging layer.

In the embodiment of the present disclosure, the plurality of functional units in FIGS. 1 to 3 may include at least one of a sensor functional unit configured to implement a sensor function and a solar energy acquisition unit configured to implement a solar cell function. The sensor functional unit may include at least one of a fingerprint acquisition sensor unit, an infrared sensor unit, and a photosensor unit.

The embodiment of the present disclosure is described by taking an example in which a plurality of functional units may include an infrared sensor unit or a solar energy acquisition unit as follows.

In one aspect, the infrared sensor unit may include a semiconductor device. The semiconductor device is sensitive to infrared light. When the infrared sensor unit is operating, an infrared ray irradiates the semiconductor device to increase its temperature, and the temperature rise causes the resistance of the semiconductor device to change. The amount of change in the resistance of the device can be used to detect the intensity of the infrared ray to achieve perception of an object. It should be noted that the infrared sensor unit may include: a detection control module, which can apply a voltage to the semiconductor device, and measure change in the resistance of the semiconductor device by detecting change in the current on the semiconductor device, and then obtain the change in infrared intensity.

Figure 5:
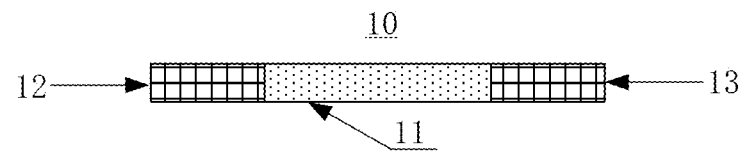
FIG. 5 is a schematic structural diagram of an infrared sensor unit according to an embodiment of the present disclosure.
Figure 6:
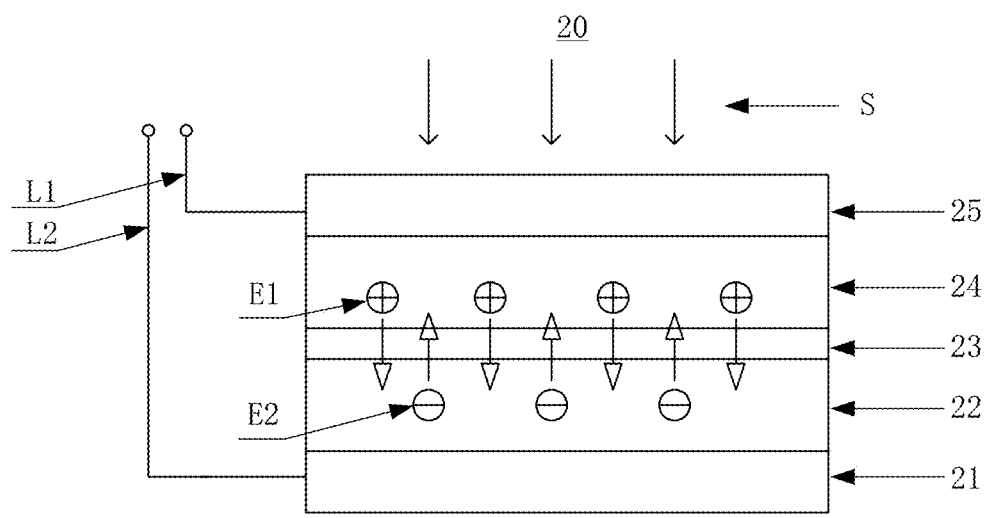
FIG. 6 is a schematic structural diagram of a solar energy acquisition unit according to an embodiment of the present disclosure.

For example, the infrared sensor unit 10 may be as shown in FIG. 5. The infrared sensor unit 10 includes a semiconductor device 11 and first and second electrodes 12 and 13 disposed on the two sides of the semiconductor device 11. The first electrode 12 is coupled to a voltage input line (not shown in FIG. 5) which is configured to input a voltage signal, and the second electrode 13 is coupled to a current detection line (not shown in FIG. 5) which is configured to detect a magnitude of the current. The above detection control module includes a first electrode 12, a second electrode 13, and a voltage input line and a current detection line.

When the infrared sensor unit is operating, an infrared ray irradiates the semiconductor device 11 to increase its temperature, and the temperature rise causes the resistance of the semiconductor device 11 to change. By detecting the change in the resistance of the semiconductor device 11, the detection of the light intensity can be realized, thereby realizing perception of an object. As can be seen from FIG. 5, the voltage input line applies a voltage to the semiconductor device 11 through the first electrode 12 and the second electrode 13, and the current detection line coupled to the second electrode 13 detects the current change on the current detection line. The change in the resistance of the semiconductor device 11 can be measured and then the change in the light intensity can be determined.

In practical application, the above-mentioned detection control module may be disposed outside the functional panel, such as a display panel, which is not limited in the embodiment of the present disclosure.

Figures 1, 7:
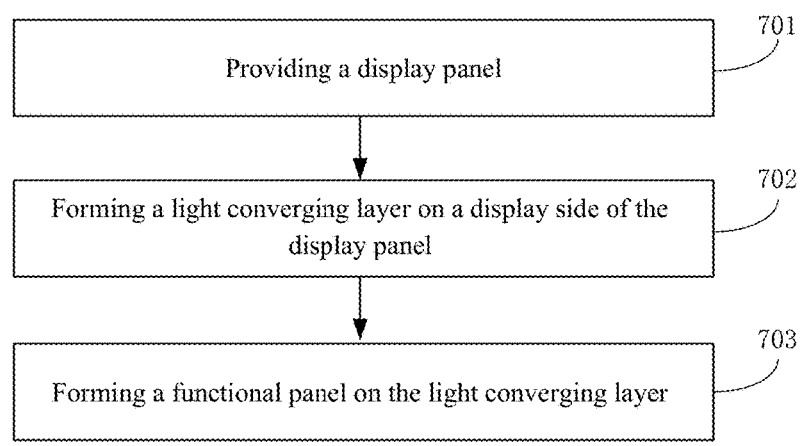
Figures 2, 7:
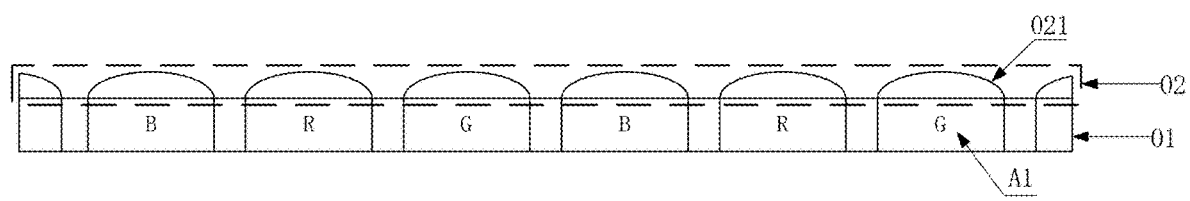
Figures 3, 7:
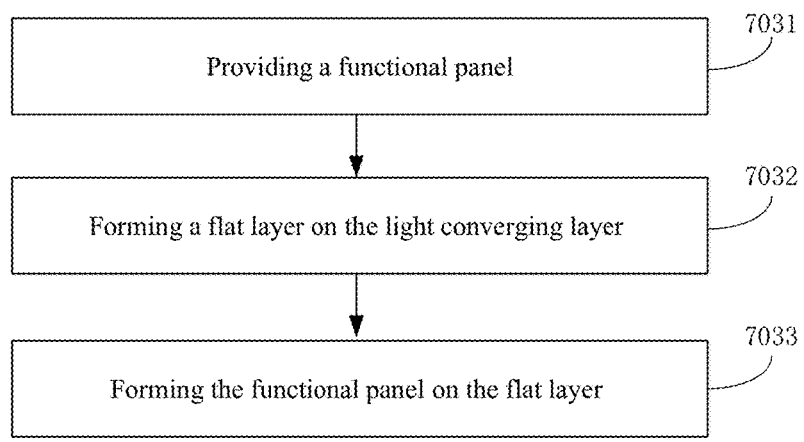
Figures 4, 7:
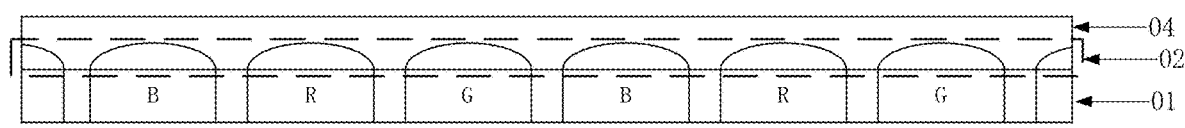

In the other aspect, the above solar energy collection unit may be an optoelectronic semiconductor sheet that generates electricity directly from sunlight. The optoelectronic semiconductor sheet may output a voltage when irradiated with light of a certain intensity and may generate a current when there is a loop. For example, as shown in FIG. 7, the solar energy acquisition unit includes an upper electrode 25 and a lower electrode 21, and N-type silicon 24 disposed on the side of the upper electrode 25 and P-type silicon 22 disposed on the side of the lower electrode. The PN junction 23 is disposed between the N-type silicon 24 and the P-type silicon 23.

As can be seen from FIG. 7, when the solar energy acquisition unit is operating, when sunlight S irradiates the solar energy acquisition unit 20, an electron-hole pair is formed in the PN junction 23 and a barrier electric field is generated. Under the action of the barrier electric field, the hole E1 is driven toward the P-type silicon 22, the electron E2 is driven toward the N-type silicon 23, such that the N-type silicon 24 has excess an electron E2, and the P-type silicon 22 has an excess hole E1 at the PN junction 23. An electric field opposite to the direction of the barrier electric field is formed near the PN junction 23. The upper electrode 25 is connected through a wire L1, and the lower electrode 21 is connected through a wire L2 externally to other circuit element such as a battery to form a loop, to complete solar energy acquisition. The above electron-hole pair means that when light irradiates the semiconductor, photons are absorbed and electrons in the valence band are excited into the conduction band, and an electron-hole pair is formed in the valence band. The above barrier electric field refers to an electric field generated when an electron-hole pair is formed in a PN junction.

Accordingly, the display component according to the embodiment of the present disclosure has a light converging layer and a functional panel disposed on the display panel. That is, the display panel and the functional panel are disposed in different layers such that the collimated light emitted from each sub-pixel can be converged by the corresponding light converging unit and emitted to the corresponding transparent area. In this way, without reducing the sizes of the sub-pixels and the functional units, it can ensure the actual brightness of the light emitted by the display component. Therefore, it can achieve excellent compatibility of the display function and other functions of the current display component.

A method for manufacturing a display component according to an embodiment of the present disclosure, as shown in FIG. 7-1, includes the following steps.

In step 701, a display panel is provided.

The display panel may be an OLED display panel or a LCD display panel. The display panel includes a plurality of pixels arranged in an array, and each pixel includes a plurality of sub-pixels.

In step 702, a light converging layer is formed on the display side of the display panel.

The light converging layer 02 includes a plurality of light converging units 021 arranged in an array, and the display panel 01 formed with the light converging layer 02 is as shown in FIG. 7-2. One light-light converging unit 021 is disposed on each sub-pixel A1.

The light converging layer may be formed through various manners. For example, a transparent film layer may be formed on a display panel first, and then the transparent film layer may be performed with a patterning process to obtain a light converging layer having a certain pattern. The patterning process includes: photoresist coating, exposure, development, etching and photoresist stripping.

In practical application, nanoimprint technology may also be used to form a light converging layer on the display side of the display panel. Nanoimprint technology refers to a technique of forming a specified pattern on a base substrate by pressing at the nanometer level. For example, a transparent film layer may be formed on the display panel first, and a light converging layer as shown in FIG. 7-2 may be formed by pressing.

In step 703, a functional panel is formed on the light converging layer, and the functional panel is configured to implement a preset non-display function.

The functional panel includes a plurality of functional units arranged in an array. A transparent area is provided between every two adjacent functional units, and each of the plurality of transparent areas on the functional panel corresponds to each of the plurality of sub-pixels on the display panel in a one-to-one correspondence. The collimated light emitted by the sub-pixel is converged by the corresponding light converging unit and emitted to the corresponding transparent area. The resulted display component is shown in FIG. 1.

Optionally, as shown in FIG. 7-3, the process of forming the functional panel on the light converging layer may include the following steps.

In step 7031: a functional panel is provided, and the functional panel includes a base substrate and a plurality of functional units disposed on the base substrate.

In step 7032: a planarization layer is formed on the light converging layer.

Optionally, a planarization layer 04 may be formed on the light converging layer 02 by coating or sputtering, and the light converging layer 02 formed with the planarization layer 04 is shown in FIG. 7-4.

In step 7033, a functional panel is formed on the planarization layer.

In practical application, the planarization layer may be made of OC adhesive, and with the OC adhesive, the functional panel may be adhered on the light converging layer through charge-coupled device (CCD) alignment technology. The resulted display component is shown in FIG. 1 or FIG. 4. The CCD alignment technology is a technique for alignment calibration of a device using image sensor technology, and has high alignment accuracy.

The plurality of functional units include at least one of a sensor functional unit configured to implement a sensor function and a solar energy acquisition unit configured to implement a solar cell function. The sensor functional unit includes at least one of a fingerprint acquisition sensor unit, an infrared sensor unit, and a light sensor unit. For the structure thereof, reference may be made to the above device embodiment.

Accordingly, in the method for manufacturing a display component according to the exemplary embodiment of the present disclosure, a light converging layer and a functional panel are disposed on the display panel. That is, the display panel and the functional panel are disposed in different layers such that the collimated light emitted from each sub-pixel can be converged by the corresponding light converging unit and emitted to the corresponding transparent area. In this way, without reducing the sizes of the sub-pixels and the functional units, it can ensure the actual brightness of the light emitted by the display component. Therefore, it can achieve excellent compatibility of the display function and other functions of the current display component.

An embodiment of the present disclosure provides a display device. The display device includes:

a display components 00 provided in any of the above embodiments.

Optionally, the display device may include: a touch panel disposed on the functional panel; or a touch panel disposed on a non-display side of the display panel.

The display device may be any product or component having display function, such as electronic paper, mobile phone, tablet computer, television, monitor, notebook computer, digital photo frame, navigator, and the like.

With regard to the display device and the method for manufacturing the display component in the above embodiments, the exemplary manners for performing the operations of the respective modules have been described in detail in the embodiments related to the display component, and no detailed explanation will be made herein.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A display component comprising:
    a display panel, and a light converging layer and a functional panel sequentially disposed on a display side of the display panel, wherein the functional panel is configured to implement a preset non-display function;
    wherein the display panel comprises a plurality of pixels arranged in an array, each of the pixels comprises a plurality of sub-pixels, the light converging layer comprises a plurality of light converging units arranged in an array, each of the sub-pixels is provided with one of the light converging units, the functional panel comprises a plurality of functional units arranged in an array, a transparent area is provided between every two adjacent functional units, each transparent area on the functional panel corresponds to one of the plurality of sub-pixels on the display panel in a one-to-one correspondence, and collimated light emitted by each sub-pixel is converged by the corresponding light converging unit and is emitted to the corresponding transparent area, and the display component further comprises: a planarization layer disposed between the light converging layer and the functional layer, wherein a refractive index of the planarization layer is smaller than a refractive index of the light conversion layer, wherein a gap between every two adjacent sub-pixels is a gap area, and a sum of projection areas of each functional unit and one adjacent transparent area on the display panel is equal to a sum of projection areas of one sub-pixel and one gap area on the display panel, and an orthographic projection of each sub-pixel on the functional panel covers the corresponding transparent area.

2. The display component according to claim 1, wherein:
    the plurality of functional units comprise at least one of a sensor functional unit configured to implement a sensor function and a solar energy acquisition unit configured to implement a solar cell function; and
    the sensor functional unit comprises at least one of a fingerprint acquisition sensor unit, an infrared sensor unit, and a photosensor unit.

3. The display component according to claim 1, wherein the planarization layer is made of an optically clear adhesive (OC).

4. The display component according to claim 1, wherein the light converging unit is a condenser lens.

5. The display component according to claim 1, wherein a ratio of a projection area of each functional unit to a projection area of one adjacent transparent area on the display panel is about 8:2.

6. The display component according to claim 1, wherein the display panel is an organic light emitting diode OLED display panel, a liquid crystal display LCD display panel, or a micro light emitting diode LED display panel.

7. A display device, comprising:
    the display component according to claim 1.

8. The display device according to claim 7, further comprising:
    a touch panel disposed on the functional panel; or
    a touch panel disposed on a non-display side of the display panel.

9. A method for manufacturing a display component, comprising:
    providing a display panel;
    forming a light converging layer on a display side of the display panel; an
    forming a functional panel on the light converging layer, and the functional panel is configured to implement a preset non-display function;
    wherein the display panel comprises a plurality of pixels arranged in an array, each of the pixels comprises a plurality of sub-pixels, the light converging layer comprises a plurality of light converging units arranged in an array, each of the sub-pixels is provided with one of the light converging units, the functional panel comprises a plurality of functional units arranged in an array, a transparent area is provided between every two adjacent functional units, each transparent area on the functional panel corresponds to one of the plurality of sub-pixels on the display panel in a one-to-one correspondence, and collimated light emitted by each sub-pixel is converged by the corresponding light converging unit and is emitted to the corresponding transparent area, and the step of forming a functional panel on the light converging layer comprises:
    providing a functional panel, the functional panel comprising a base substrate and a plurality of functional units disposed on the base substrate;
    forming a planarization layer on the light converging layer; and
    forming the functional panel on the planarization layer, wherein the planarization layer is made of an optically clear adhesive (OC), and the step of forming the functional panel on the planarization layer comprises:
    adhering the functional panel on the light converging layer with the optically clear adhesive (OC) through charge-coupled device CCD alignment technology.

10. The method according to claim 9, wherein
    the step of forming a light converging layer on a display side of the display panel comprises:
    forming the light converging layer on the display side of the display panel by using nanoimprint technology.

11. The method according to claim 9, wherein
    the plurality of functional units comprise at least one of a sensor functional unit configured to implement a sensor function and a solar energy acquisition unit configured to implement a solar cell function; and
    the sensor functional unit comprises at least one of a fingerprint acquisition sensor unit, an infrared sensor unit, and a photosensor unit.

* * * * *